(12) United States Patent
Walitzki et al.

(10) Patent No.: US 8,541,678 B2
(45) Date of Patent: *Sep. 24, 2013

(54) THERMIONIC/THERMOTUNNELING THERMO-ELECTRICAL CONVERTER (75) Inventors: Hans Juergen Walitzki, Portland, OR (US); Isaiah Watas Cox, Baltimore, MD (US)

(73) Assignee: Borealis Technical Limited (GI)

( * ) Notice: Subject to any disclaimer, the term of this patent is extended or adjusted under 35 U.S.C. 154(b) by 492 days.

This patent is subject to a terminal disclaimer.

(21) Appl. No.: 11/992,995

(22) PCT Filed: Oct. 4, 2006

(86) PCT No.: PCT/US2006/039130
§ 371 (c)(1),
(2), (4) Date: Apr. 1, 2008

(87) PCT Pub. No.: WO2007/044517
PCT Pub. Date: Apr. 19, 2007

(65) Prior Publication Data
US 2009/0223548 A1 Sep. 10, 2009

Related U.S. Application Data

(63) Continuation-in-part of application No. 11/376,520, filed on Mar. 14, 2006, now Pat. No. 7,589,348.

(60) Provisional application No. 60/724,549, filed on Oct. 6, 2005, provisional application No. 60/662,058, filed on Mar. 14, 2005.

(51) Int. Cl.
*H01L 37/00* (2006.01)
*H01L 35/30* (2006.01)
*H01L 21/00* (2006.01)

(52) U.S. Cl.
USPC ............................ 136/201; 136/205; 438/54

(58) Field of Classification Search
USPC ................. 136/201, 205; 438/54; 62/3.2; 257/E21.158
See application file for complete search history.

(56) References Cited

U.S. PATENT DOCUMENTS

| | | | | |
|---|---|---|---|---|
| 3,217,696 | A * | 11/1965 | Kiekhaefer | 123/2 |
| 6,232,542 | B1 * | 5/2001 | Hiraishi et al. | 136/201 |
| 6,281,514 | B1 * | 8/2001 | Tavkhelidze | 250/493.1 |
| 6,288,426 | B1 * | 9/2001 | Gauthier et al. | 257/347 |
| 6,573,504 | B2 * | 6/2003 | Iida et al. | 250/338.4 |
| 6,743,972 | B2 * | 6/2004 | Macris | 136/201 |
| 6,753,239 | B1 * | 6/2004 | Conn | 438/459 |
| 7,002,071 | B1 * | 2/2006 | Sadatomi et al. | 136/239 |
| 2003/0042819 | A1 * | 3/2003 | Martinovsky et al. | 310/306 |
| 2004/0004253 | A1 * | 1/2004 | Yi | 257/347 |
| 2005/0147841 | A1 * | 7/2005 | Tavkhelidze et al. | 428/687 |
| 2005/0150537 | A1 * | 7/2005 | Ghoshal | 136/205 |

FOREIGN PATENT DOCUMENTS

| | | | |
|---|---|---|---|
| WO | WO00/54343 | * | 9/2000 |
| WO | WO 03/083177 | * | 10/2003 |

* cited by examiner

*Primary Examiner* — Jonathan Johnson
*Assistant Examiner* — Tamir Ayad (57) ABSTRACT

A thermionic or thermotunneling converter consisting of two electrodes maintained at a desired distance from one another by means of spacers in which the electrodes comprise silicon coated with a hard material, or comprise a ceramic or other refractory material. The spacers are formed by oxidizing one electrode, protecting certain oxidized areas and removing the remainder of the oxidized layer. The protected oxidized areas remain as spacers. These spacers have the effect of maintaining the electrodes at a desired distance without the need for active elements, thus greatly reducing costs.

33 Claims, 10 Drawing Sheets

THERMIONIC/THERMOTUNNELING THERMO-ELECTRICAL CONVERTER

CROSS-REFERENCE TO RELATED APPLICATIONS

This application is the U.S. national stage application of International Application No. PCT/US2006/039130, filed Oct. 4, 2006, which international application was published on Apr. 19, 2007, as International Publication WO2007/044517 in the English language. The International Application claims the benefit of U.S. Provisional Patent Application No. 60/724,549, filed Oct. 6, 2005 and U.S. patent application Ser. No. 11/376,520, filed Mar. 14, 2006. This application is also a Continuation in Part of U.S. patent application Ser. No. 11/376,520, filed Mar. 6, 2006, which application claims the benefit of U.S. Provisional App. No. 60/662,058, filed Mar. 14, 2005. The above-mentioned patent applications are herein incorporated in their entirety by reference.

TECHNICAL FIELD

The present invention relates to thermionic and thermotunneling thermo-electric conversion devices.

BACKGROUND ART

Definitions

"Thermionic or thermotunneling converter" is hereby defined as either a Power Chip; a device that uses a thermal gradient to create electrical power, or a Cool Chip; a device that uses electrical power or energy to pump heat, thereby creating, maintaining, or degrading a thermal gradient. Power Chips and Cool Chips may accomplish this using thermionics, thermotunneling, or other methods as described in this application. It is understood that the present invention relates to Power Chips and Cool Chips.

"Gap diode" is defined as any diode which employs a gap between the anode and the cathode, or the collector and emitter, and which causes or allows electrons to be transported between the two electrodes, across or through the gap. The gap may or may not have a vacuum between the two electrodes, though gap diodes specifically exclude bulk liquids or bulk solids in-between the anode and cathode. The gap diode may be used for Cool Chips, Power Chips, and for other diode applications.

In what follows, the term 'Avto Metals' is to be understood as a metal film having a modified shape, which alters the electronic energy levels inside the modified electrode, leading to a decrease in electron work function as described in the foregoing, and illustrated in FIG. 1 below.

"Matching" surface features of two facing surfaces of electrodes means that where one has an indentation, the other has a protrusion and vice versa. Thus, the two surfaces are substantially equidistant from each other in operation.

Silicon has three well-known properties pertinent to its use in thermionic/thermotunneling devices at elevated temperatures (i.e. >800° K.): (1) many materials diffuse quite easily into silicon, (2) it is able to flow into adjacent regions, and (3) it is very reactive. Whilst silicon will not break at 1200° K., it will start to flow, limiting the operational lifetime of devices having close-spaced electrodes that are fabricated from this material; essentially the gap would fill in, depending on the temperature, over a period of days or months. In general then, silicon is a good solution for manufacturing devices having a long operating life only when the operating temperature does not exceed 800-900° K.

In U.S. Pat. Nos. 6,281,514, 6,531,703 and 6,495,843 and WO9940628, a method is disclosed for promoting the passage of elementary particles at or through a potential barrier comprising providing a potential barrier having a geometrical shape for causing de Broglie interference between the elementary particles. In another embodiment, the invention provides an elementary particle-emitting surface having a series of indents. The depth of the indents is chosen so that the probability wave of the elementary particle reflected from the bottom of the indent interferes destructively with the probability wave of the elementary particle reflected from the surface. This results in the increase of tunneling through the potential barrier. When the elementary particle is an electron, electrons tunnel through the potential barrier, thereby leading to a reduction in the effective work function of the surface. In further embodiments, the invention provides vacuum diode devices, including a vacuum diode heat pump, a thermionic converter and a photoelectric converter, in which either or both of the electrodes in these devices utilize said elementary particle-emitting surface. In yet further embodiments, the invention provides devices in which the separation of the surfaces in such devices is controlled by piezo-electric positioning elements. A further embodiment provides a method for making an elementary particle-emitting surface having a series of indents.

In U.S. Pat. No. 6,117,344 and WO9947980, methods are described for fabricating nano-structured surfaces having geometries in which the passage of elementary particles through a potential barrier is enhanced. The methods use combinations of electron beam lithography, lift-off, and rolling, imprinting or stamping processes.

In U.S. Pat. No. 6,680,214, a method is disclosed for the induction of a suitable band gap and electron emissive properties into a substance, in which the substrate is provided with a surface structure corresponding to the interference of electron waves. Lithographic or similar techniques are used, either directly onto a metal mounted on the substrate, or onto a mold which then is used to impress the metal. In a preferred embodiment, a trench or series of nano-sized trenches are formed in the metal.

Figure 1:
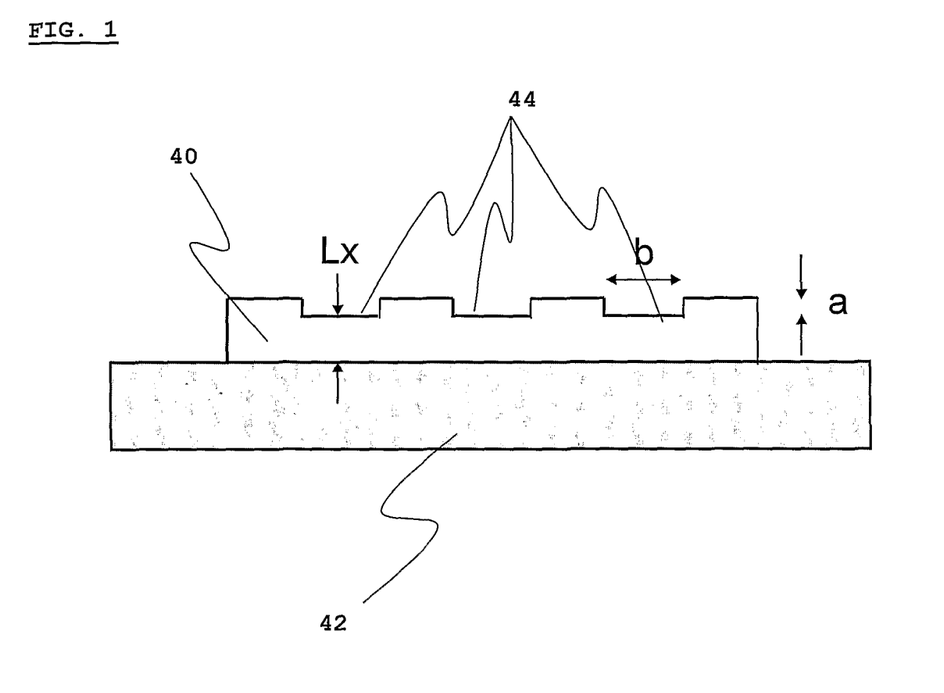
FIG. 1 is a diagrammatic representation of a possible realization with an indented wall. Indents are etched on the surface of thin film deposited on insulating substrate.

In WO03/083177, the use of electrodes having a modified shape and a method of etching a patterned indent onto the surface of a modified electrode, which modifies the electronic energy levels inside the modified electrode, leading to a decrease in electron work function is disclosed. The method comprises creating an indented or protruded structure on the surface of a metal. The depth of the indents or height of protrusions is equal to a, and the thickness of the metal is Lx+a. The minimum value for a is chosen to be greater than the surface roughness of the metal. Preferably the value of a is chosen to be equal to or less than Lx/5. The width of the indentations or protrusions is chosen to be at least 2 times the value of a. Typically the depth of the indents is $\geq \lambda/2$, wherein $\lambda$ is the de Broglie wavelength, and the depth is greater than the surface roughness of the metal surface. Typically the width of the indents is $>>\lambda$, wherein $\lambda$ is the de Broglie wavelength. Typically the thickness of the indents is a multiple of the depth, preferably between 5 and 15 times said depth, and preferably in the range 15 to 75 nm. FIG. 1 shows the shape and dimensions of a modified electrode having a thin metal film 40 on a substrate 42. Indent 44 has a width b and a depth a relative to the height of metal film 40. Film 40 comprises a metal whose surface should be as planar as possible as surface roughness leads to the scattering of de Broglie waves. Metal film 40 is given sharply defined geometric patterns or indent 44 of a dimension that creates a de Broglie wave interference pattern that leads to a decrease in the electron work function, thus facilitating the emissions of electrons from the surface and promoting the transfer of elementary particles across a potential barrier. The surface configuration of the modified electrode may resemble a corrugated pattern of squared-off, "u"-shaped ridges and/or valleys. Alternatively, the pattern may be a regular pattern of rectangular "plateaus" or "holes," where the pattern resembles a checkerboard. The walls of indent 44 should be substantially perpendicular to one another, and its edges should be substantially sharp. The surface configuration comprises a substantially planar slab of a material having on one surface one or more indents of a depth approximately 5 to 20 times a roughness of said surface and a width approximately 5 to 15 times said depth. The walls of the indents are substantially perpendicular to one another, and the edges of the indents are substantially sharp.

In U.S. Pat. No. 6,720,704, diode devices are disclosed in which the separation of the electrodes is set and controlled using piezo-electric, electrostrictive or magnetostrictive actuators. This avoids problems associated with electrode spacing changing or distorting as a result of heat stress. In addition it allows the operation of these devices at electrode separations which permit quantum electron tunneling between them. Pairs of electrodes whose surfaces replicate each other are also disclosed. These may be used in constructing devices with very close electrode spacings.

In U.S. Pat. No. 6,417,060, a method for manufacturing a pair of electrodes comprises fabricating a first electrode with a substantially flat surface and placing a sacrificial layer over a surface of the first electrode, wherein the sacrificial layer comprises a first material. A second material is placed over the sacrificial layer, wherein the second material comprises a material that is suitable for use as a second electrode. The sacrificial layer is removed with an etchant, wherein the etchant chemically reacts with the first material, and further wherein a region between the first electrode and the second electrode comprises a gap that is a distance of 50 nanometers or less, preferably 5 nanometers or less. Alternatively, the sacrificial layer is removed by cooling the sandwich with liquid nitrogen, or alternatively still, the sacrificial layer is removed by heating the sacrificial layer and thereby evaporating the sacrificial layer.

In U.S. Pat. No. 6,774,003, a method for manufacturing a pair of electrodes comprises fabricating a first electrode with a substantially flat surface and placing a sacrificial layer over a surface of the first electrode, wherein the sacrificial layer comprises a first material. A second material is placed over the sacrificial layer, wherein the second material comprises a material that is suitable for use as a second electrode. The sacrificial layer is removed with an etchant, wherein the etchant chemically reacts with the first material, and further wherein a region between the first electrode and the second electrode comprises a gap that is a distance of 50 nanometers or less, preferably 5 nanometers or less. Alternatively, the sacrificial layer is removed by cooling the sandwich with liquid nitrogen, or alternatively still, the sacrificial layer is removed by heating the sacrificial layer, thereby evaporating the sacrificial layer.

In U.S. Patent Application Publication 2003/0068431, materials bonded together are separated using electrical current, thermal stresses, mechanical force, any combination of the above methods, or any other application or removal of energy until the bonds disappear and the materials are separated. In one embodiment the original bonding was composed of two layers of material. In another embodiment, the sandwich was composed of three layers. In a further embodiment, the parts of the sandwich are firmly maintained in their respective positions during the application of current so as to be able to subsequently align the materials relative to one another.

En WO03090245, a gap diode is disclosed in which a tubular actuating element serves as both a housing for a pair of electrodes and as a means for controlling the separation between the electrode pair. In a preferred embodiment, the tubular actuating element is a quartz piezo-electric tube. In accordance with another embodiment of the present invention, a gap diode is disclosed which is fabricated by micromachining techniques in which the separation of the electrodes is controlled by piezo-electric, electrostrictive or magnetostrictive actuators. Preferred embodiments of gap diodes include Cool Chips, Power Chips, and photoelectric converters.

In U.S. Pat. No. 3,169,200, a multilayer converter is described which comprises two electrodes, intermediate elements and oxide spacers disposed between each adjacent element. A thermal gradient is maintained across the device and opposite faces on each of the elements serve as emitter and collector. Electrons tunnel through each oxide barrier to a cooler collector, thereby generating a current glow through a load connected to the two electrodes. One drawback is that the device must contain some 106 elements in order to provide reasonable efficiency, and this is difficult to manufacture. A further drawback results from the losses due to thermal conduction: although the oxide spacers have a small contact coefficient with the emitter and collector elements, which minimizes thermal conduction, the number of elements required for the operation of the device means that thermal conduction is not insignificant.

In U.S. Patent Application Publication 2003/0042819, a thermotunneling converter is disclosed comprising a pair of electrodes having inner surfaces substantially facing one another, and a spacer or plurality of spacers positioned between the two electrodes, having a height substantially equal to the distance between the electrodes, and having a total cross-sectional area that is less than the cross-sectional area of either of the electrodes. In a preferred embodiment, a vacuum is introduced, and in a particularly preferred embodiment, gold that has been exposed to cesium vapor is used as one or both of the electrodes. In a further embodiment, the spacer is made of small particles disposed between the electrodes. In a yet further embodiment, a sandwich is made containing the electrodes with an unoxidized spacer. The sandwich is separated and the spacer is oxidized, which makes it grow to a required height whilst giving it insulatory properties, to allow for tunneling between the electrodes.

DISCLOSURE OF INVENTION

From the foregoing, it may be appreciated that a need has arisen for thermionic/thermotunneling devices for thermal-electric conversion which can provide electrode separation and maintain the gap between them without the use of active elements and in which problems of thermal conduction between its layers are reduced or eliminated.

The present invention is directed towards a thermionic/thermotunneling thermoelectric converter comprising electrodes having surfaces substantially facing one another, and which are separated by spacers disposed between the electrodes so that there is a gap between the electrodes; the surface area of the spacers in contact with the electrodes is less than the surface area of the electrodes not in contact with the spacers.

In one aspect, the present invention is a thermoelectric converter comprising a first array comprising a plurality of electrodes having surfaces substantially facing electrodes of a second array comprising a plurality of electrodes; and in which a respective spacer or plurality of spacers is disposed between the arrays to allow gaps between the electrodes, and where the surface area of the spacer or plurality of spacers in contact with the surfaces is less than the surface area of said surfaces.

In a further aspect, the present invention is a thermionic/thermotunneling device for thermo-electric conversion, which is able to operate over long periods of time at high temperatures and in which the substrate is prevented from reacting with, diffusing into or flowing into adjacent regions in an unacceptable manner. Whilst silicon will not break at 1200° K, it will start to flow, limiting the operational lifetime of devices having close-spaced electrodes that are fabricated from this material; essentially the gap would fill in, depending on the temperature, over a period of days or months. In general, silicon is a good solution for devices having long operating life only when the operating temperature does not exceed 800-900° K. Preferably the substrate is silicon coated with CVD diamond, or comprises a ceramic or other refractory material.

In a further aspect, the present invention is directed toward an electrode for use in such a device that comprises an electrode surface having protrusions.

The present invention is also directed toward a method for making a gap diode device comprising the steps of: oxidizing the surface of a substrate material; protecting selected areas of the oxidized layer in such a way that the protected areas are much less than the unprotected areas; removing areas of said oxidized layer which have not been protected, so that the protected areas remain as protrusions; and contacting an electrode so formed to another electrode, whereby the electrodes are positioned substantially facing each other, at a distance determined by the height of the protrusions.

In a further aspect, the process is extended to produce multiple thermionic or thermotunneling gap diodes, and this embodiment the substrate material is a silicon sheet carrying multiple electrode regions, which is oxidized and protected as above prior to removing areas of the oxidized layer which have not been protected, so that the protected areas remain as protrusions; contacting the silicon sheet to another silicon sheet to form a composite wafer, whereby the electrodes are positioned substantially facing each other, at a distance determined by the height of the protrusions; and dicing the composite wafer to the size of the electrodes, to obtain individual thermionic or thermotunneling gap diode devices.

In a further aspect the process is extended to build individual integrated circuits with integrated active cooling devices in which the step of contacting the electrode formed as described above with another electrode comprises connecting the electrode with protrusions to a sheet of integrated circuits and dicing the composite wafer to form individual integrated circuits with integrated active cooling.

The present invention utilizes a wafer bonding technique to create the conditions required for thermoelectric conversion. This involves bringing two conductive planes to within 10-1000 nm without causing electrical or thermal "shorts". Silicon on insulator techniques are widely used to bond two silicon wafers with thin oxide layers in between. However, the thermal leakage of a 10 nm $SiO_2$ layer is 4-5 orders of magnitude too large for effective thermo-electric conversion. This can easily be mitigated by not bonding the entire surface. If a small particle is trapped in between two silicon wafers, due to the mechanical properties of silicon, a non-bonded area (void) of 5000 times the size (height) of the particle is created. For example, if a particle of height Z is trapped between two silicon wafers, a void with an area of approximately $5000Z^2$ is formed. Consequently, if two particles are spaced a distance apart, whereby the size of the distance is less than 2×5000 the size of the particles; an even larger void is created. Using this idea, it is possible to form small "spacers" that maintain a gap between the wafers.

This invention sets and maintains a gap between the electrodes of a thermotunneling device without the use of active elements, and therefore problems of thermal conduction between its layers are reduced or eliminated.

Furthermore, using this method to create gap diode devices is inexpensive as it does not require active elements such as piezoelectric actuators to create and maintain the gap.

Furthermore, this invention discloses methods for manufacturing thermotunneling converters on a large scale, thus reducing costs and increasing possibilities for potential applications.

BRIEF DESCRIPTION OF DRAWINGS

For a more complete explanation of the present invention and the technical advantages thereof, reference is now made to the following description and the accompanying drawings, in which:

FIG. 12 shows a cross sectional view of an electrode sandwich comprising two silicon wafers with a layer of silicon oxide in between;

BEST MODE FOR CARRYING OUT THE INVENTION

It is understood that the present invention refers to thermo-electric conversion and may be used in both Cool Chips and Power Chips: in cooling and in power generating applications. In this context, the term "thermoelectric" is to be understood to include both "thermotunneling" and "thermionic" applications, and in the following disclosure "thermotunneling" is used by way of an example only.

Instances in which forthcoming descriptions refer to a cooling device are by way of an example only and should not serve to limit the present invention.

Embodiments of the present invention and their technical advantages may be better understood by referring to FIGS. 2-13b.

In a first embodiment, a silicon substrate is coated with a hard coating of a material that reduces the diffusivity of metals into silicon. This is done prior to introducing the layer of Avto Metals and the electrical contacts which run from the Avto Metals layer out of the device. The hard coating may be chemically or physically inserted. Preferably the hard coating is CVD diamond.

In a second embodiment, the silicon substrate is substituted by a ceramic or other refractory material. The roughness of these materials is such that a 0.01-5 μm gap between electrodes may be maintained. Preferably, the material has a high melting temperature, high mechanical strength and good thermal conductivity. Preferably the material has a low brittleness, allowing for bowing without cracking during operation. It is not necessary that the material be electrically conductive, as electrical contacts are provided by additional films.

In a third embodiment, the ceramic substrate is coated with a thin film of polycrystalline or amorphous silicon to enhance the bonding performance. This thin film can be used as deposited or can be smoothened by chemical-mechanical polishing or etching processes known in the art. Suitable deposition processes are CVD or PVD (sputtering) techniques that are common in the semiconductor industry.

In a fourth embodiment, the thin film of silicon deposited onto a ceramic substrate can be structured to obtain a pattern to reduce the work-function of additionally applied materials. The structuring of silicon can be done with better perfection and at lower cost than most ceramic materials with methods known in the art.

The present invention is directed to a method for building thermotunneling converters. One particular application of this method, as disclosed below, relates to building thermotunneling converters on a large scale for the purpose of cooling integrated circuits (ICs).

Figure 2:
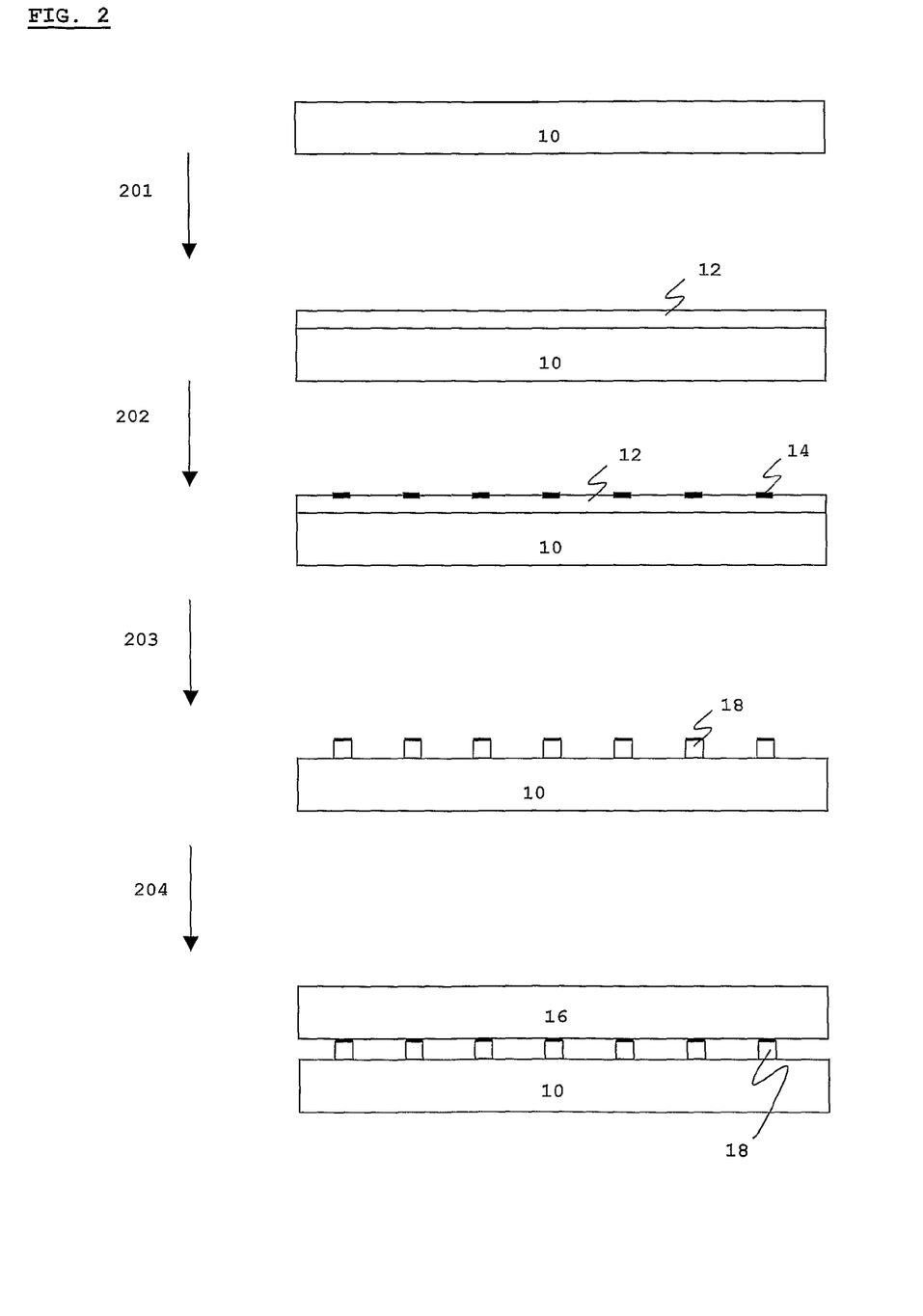
FIG. 2 is a cross sectional view of a process for building thermotunneling converters.

Referring now to FIG. 2, which shows a diagrammatic representation of a process for building thermotunneling converters, in a step 201, the surface of a silicon wafer 10 is oxidized to create a thin oxide film 12. Preferably, film 12 has a thickness of the order of 100 nm. In a step 202, an array of small dots 14 is created on the surface. This step may be accomplished for example and without limitation by standard photolithographic processes. In a step 203, the oxide material 12 between dots 14 is removed, thereby forming spacers 18 for example, by an etching process. In a step 204, a second silicon wafer 16, of identical dimensions to wafer 10, is bonded to the top of spacer array 18 formed in step 203.

The mechanical properties of silicon are such that if a small particle is trapped in between two silicon wafers, a non-bonded area (void) of 5000 times the size (height) of the particle is created. For example, using a 3-dimensional axis of coordinates X, Y and Z, a particle of height Z leads to a void in the X and Y dimensions of approximately 5000 Z in each of X and Y. Therefore the spacers consist of a dot of silicon oxide topped by a protective layer and will have the effect of keeping the two silicon wafers at a desired distance without the use of active elements.

This forms a structure in which the thermal flux across the assembly is reduced by the ratio of surface area of these spacers to the remaining surface area. A spacer of about 1 micrometer height leads to a gap with a diameter of approximately 5000 times that size, namely, 0.5 cm. These approximations are effective for typical 4 inch diameter silicon wafers, with a thickness of about 525 micrometers. It is understood that the invention is by no means limited to these measurements or approximations, and they are mentioned merely by way of example. A detailed example is given below.

Typically, the heat flux across such an assembly will be of the order of 0.1 W/cm$^2$ when the temperature across the assembly is 50° K. In reality, the leakage will be even smaller, because the thermal conductivity of small dots is smaller than the published data for large quartz volumes. Furthermore, the spacers can be distributed even further apart than the 2*5000*dot height (10 nm) used in this embodiment.

Preferably silicon wafers 10 and 16 have matching surfaces, meaning that where one has an indentation the other has a protrusion, and vice versa. Thus when matched, the two surfaces are substantially equidistant from each other during their operation.

For optimal performance it may be necessary to achieve a work function of 1 eV or less on the active wafer to increase cooling power by increasing tunneling and thermionic emission of electrons.

The layers on the active wafer can be introduced using approaches commonly used in the art. For example, an active layer can be introduced on to the electrode by vacuum deposition, using materials such as zinc, lead, cadmium, thallium, bismuth, polonium, tin, selenium, lithium, indium, sodium, potassium, gallium or cesium. Another possible method is sputtering, using materials such as titanium and silver. In a further example, an active layer such as copper is grown electrochemically onto the silicon layer. In another example, an electrically conducting paste, preferably silver, may be applied onto the electrode, or a thin film may be introduced using MEMS techniques. It is to be understood that the invention is in no way limited to these specific methods and they are mentioned only by way of example. Accordingly, any other suitable method may be used.

To increase the tunneling current in a thermotunneling Cool Chip, an electrostatic field would be applied across the gap by applying a Voltage potential to each wafer. Based upon the electric breakdown properties of SiO$_2$ a 5 Volt potential could be applied between the two wafers for an electric field of 5 MV, well below the 8-11 MV limit for quartz. According to published data, under these conditions the device has a cooling capacity of >>100 W/cm$^2$, making it extremely suitable for next generation of integrated circuits.

In this design, active piezo control is not required to maintain the gap between the electrodes, making the device very inexpensive. This method of building thermotunneling converters has many advantages over prior art methods, a principle advantage being that it is inexpensive to construct and maintain. Accordingly, many applications are possible.

One primary application relates to the construction of thermotunneling converters using a sheet of integrated circuits as one of the electrodes. Integrated circuits are usually manufactured in bulk on a large wafer sheet. At the end of the integrated circuit manufacturing process, the majority of the substrate is removed by grinding the backside to achieve a thickness of 50-200 μm to improve the heat transfer from the active device surface to a heat sink. This embodiment uses integrated circuits at this stage of the manufacturing process, as described below.

Figure 3:
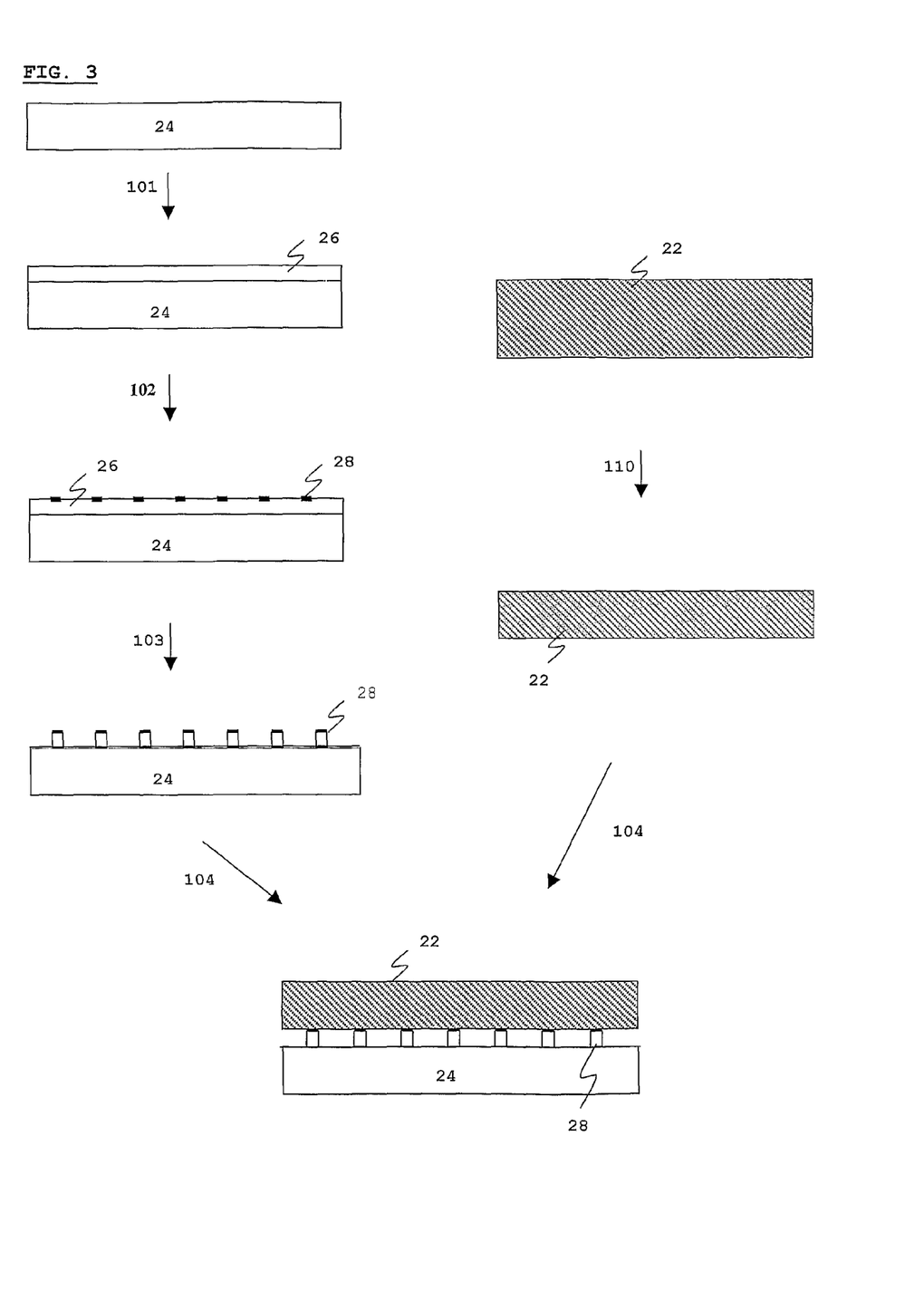
FIG. 3 is a cross sectional view of a process for building thermotunneling converters using a sheet of integrated circuits (ICs) as one of the electrodes.

FIG. 3 shows a diagrammatic representation of a process of building thermotunneling converters using an integrated circuit sheet as one of the electrodes. Referring now to FIG. 3, in a step 101, the surface of a large silicon wafer 24 is oxidized to create a thin oxide film 26, preferably with a thickness of 10 nanometers. In a step 102, an array of dots 28 are formed on oxidized surface 26, using photolithographic or other methods. In a step 103, the oxide in between dots 28 is removed by etching or other methods, to produce spacers.

In a step 110, integrated circuit silicon sheet 22, which can be any semiconductor material, of the same dimensions as sheet 24 is polished to achieve a thickness of 50-200 µm. In a step 104, sheet 24 with protruding spacers is then bonded to polished integrated circuit sheet 22. This creates a sheet of thermotunneling converters using the integrated circuit sheet as one of the electrodes.

Figure 4:
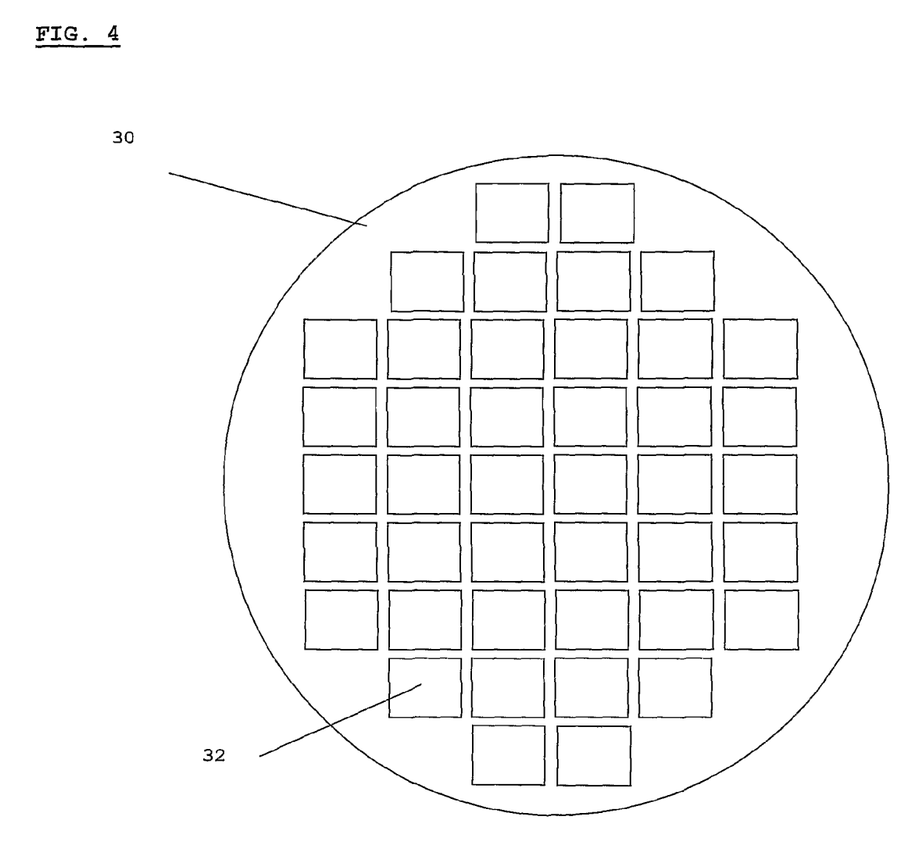
FIG. 4 shows a plan of an array comprising a plurality of thermotunneling converters created on a single wafer.

Referring now to FIG. 4, shown is a wafer 30 with an horizontal array comprising a plurality of thermotunneling converters 32 formed on the surface. In the embodiment described in FIG. 4, wafer 30 would be covered with an integrated circuit sheet of identical dimensions to wafer 30. Thermotunneling converters 32 would then be laser cut to size, creating an array comprising a plurality of individual integrated circuits with built in cooling devices. Using this method, the building process can be performed very economically on the entire wafer scale, yielding hundreds of systems from a 300 mm diameter wafer.

For purposes of illustration, below is a detailed example of the specifications of a thermotunneling converter built using the methods described above.

Example

Figure 5:
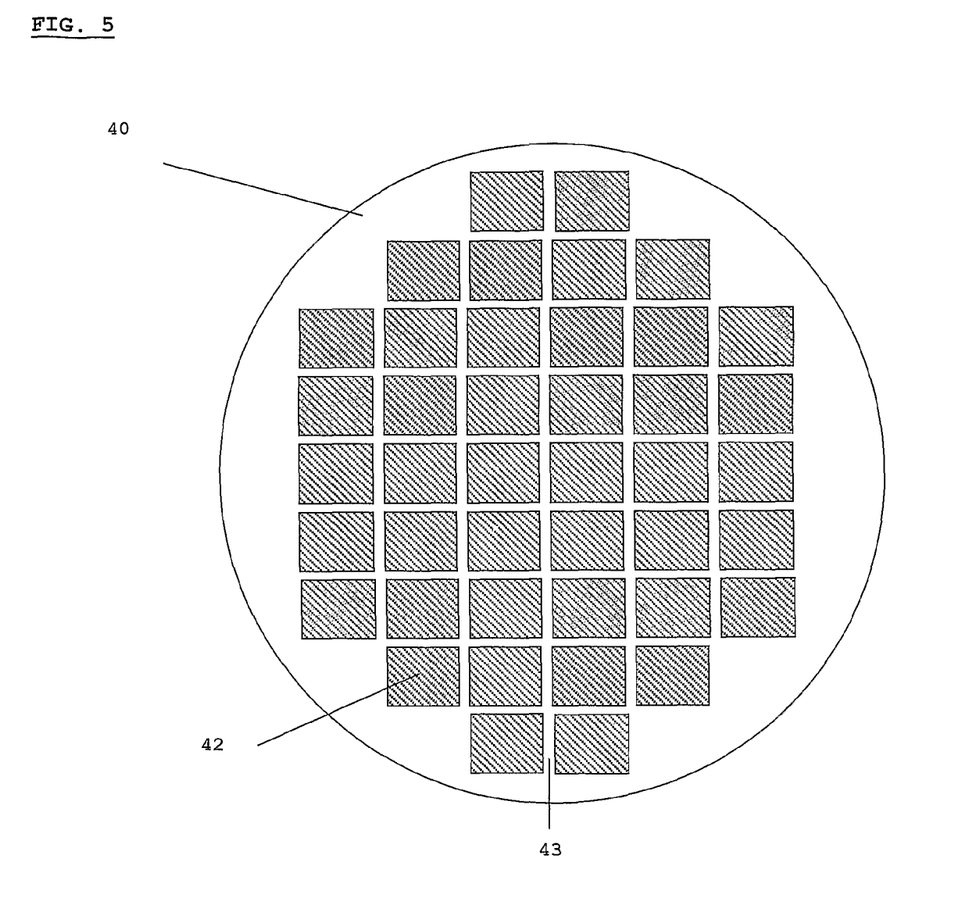
FIG. 5 shows a plan of a wafer on which an array comprising a plurality of electrodes has been arranged, further showing the spaces in-between the electrodes.
Figure 6:
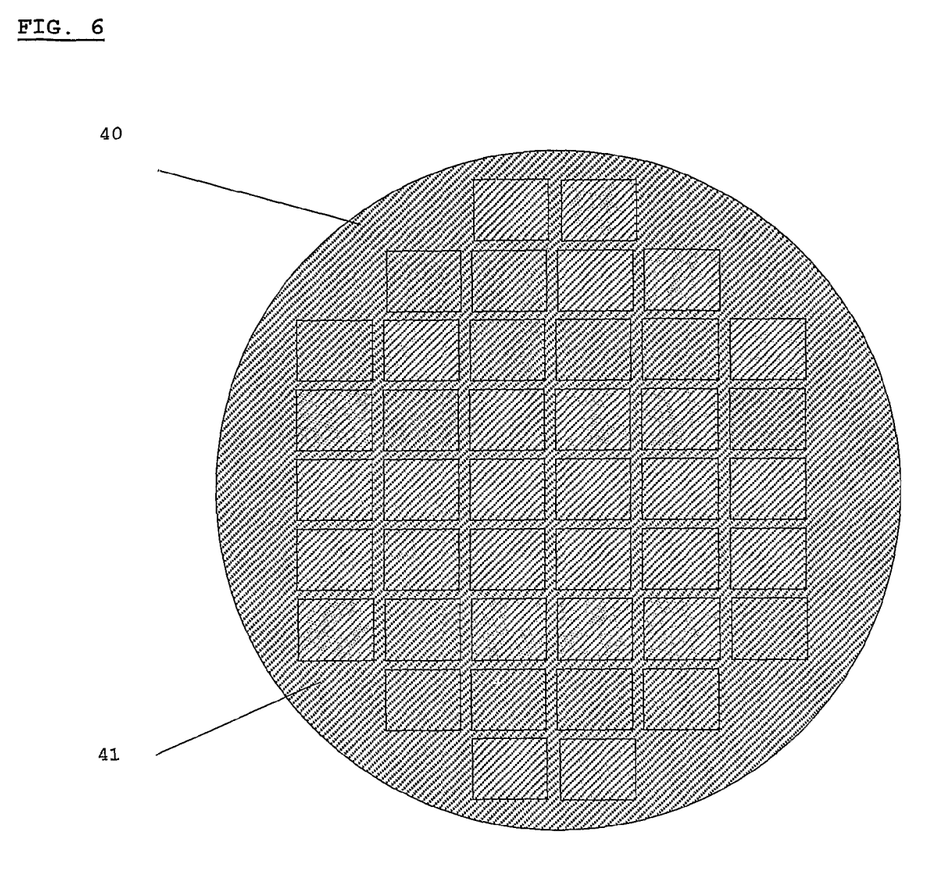
FIG. 6 shows the wafer of FIG. 5, further comprising an oxide layer.
Figure 7:
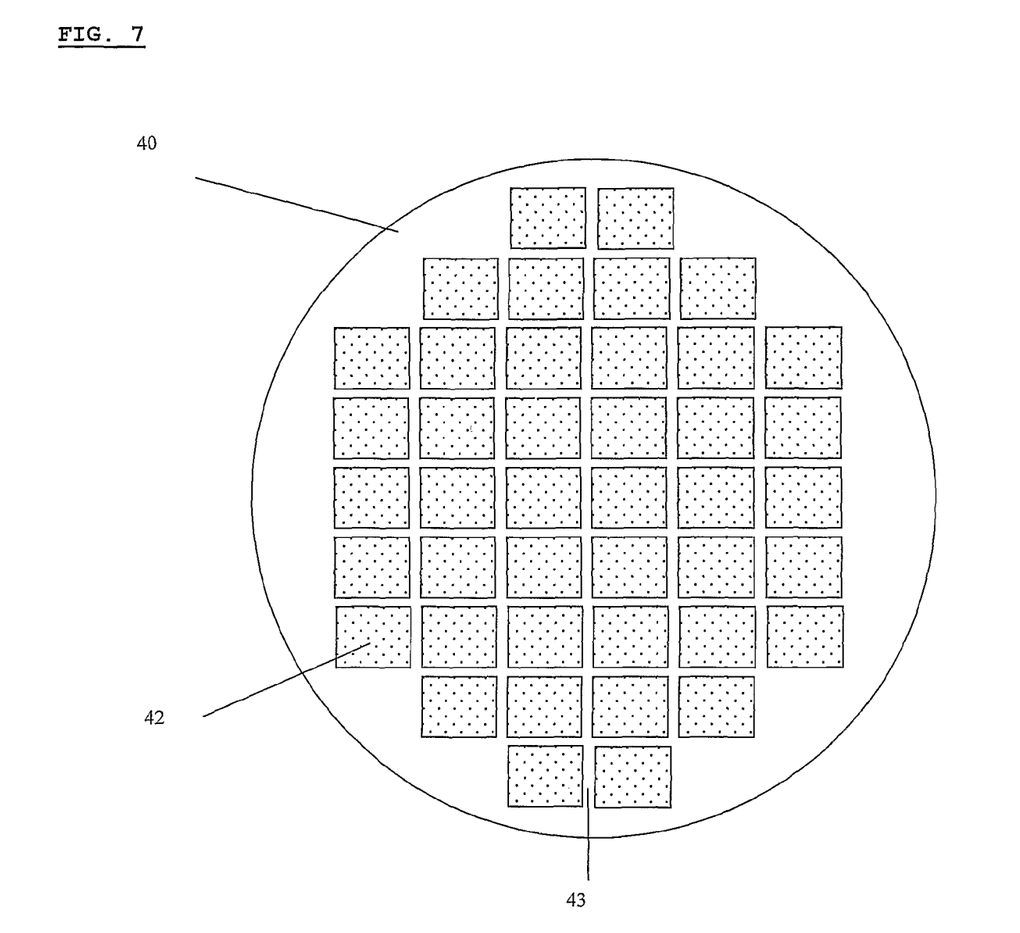
FIG. 7 shows the wafer of FIG. 6, after dots have been formed on the wafer and the remaining oxide removed.

Referring now to FIG. 5, shown is a circular silicon wafer 40 of 200 mm diameter. Arranged on the surface of wafer 40 is an array comprising a plurality of rectangular electrodes 42, 25×20 mm in size. Rectangular electrodes 42 fill as much surface space of wafer 40 as possible, while leaving an aisle 43 of 2 mm between each device. Referring now to FIG. 6, wafer 40 is oxidized to create an oxide layer 41 on the entire surface of wafer 40. FIG. 7 shows wafer 40 after dots have been formed on rectangles 42 and the oxide in between the dots removed. Oxide is also removed from aisles 43 in between rectangles 42.

The oxide in between spacer dots 44 is removed using standard methods known in the art.

Figure 9:
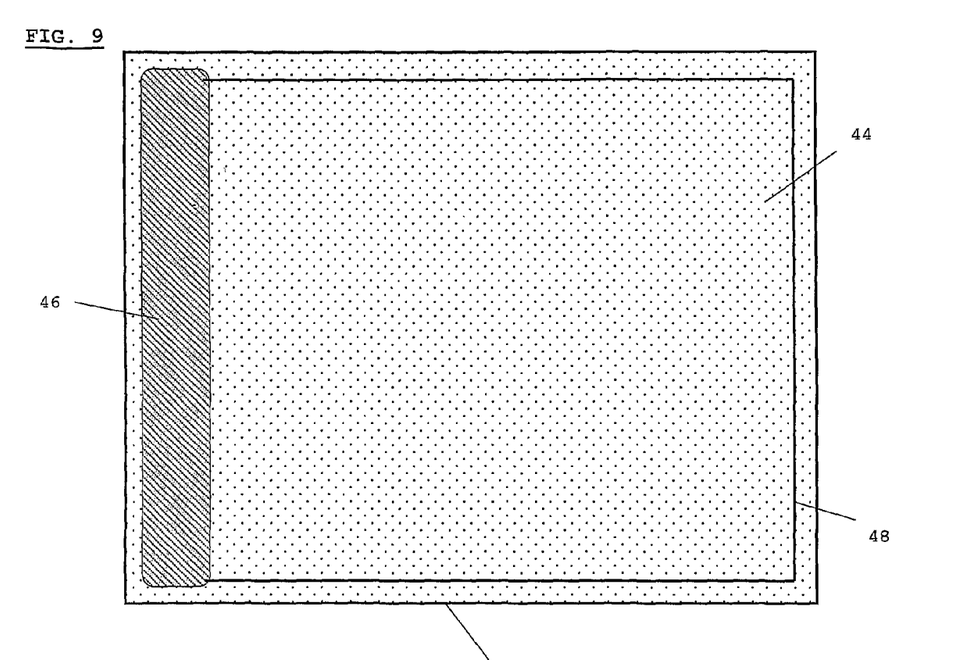
FIG. 9 shows the electrode of FIG. 8 further comprising an oxide seal.

Referring now to FIG. 9, shown is one embodiment of electrode 42 with the addition of an oxide seal 48 positioned around the perimeter of electrode 42 to maintain the vacuum inside seal 48.

Figure 10:
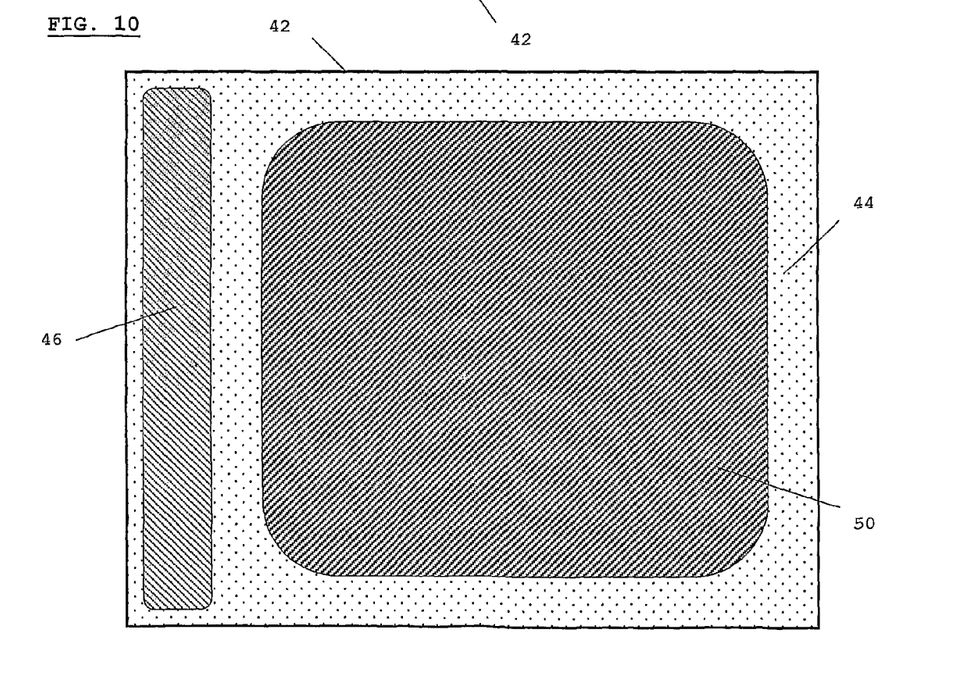
FIG. 10 shows the electrode of FIG. 8, further showing the point at which the electrode is joined to a device that is to be cooled.

Referring now to FIG. 10, a rectangular area 50 on electrode 42 is in thermal contact with a device that is to be cooled. Area 50 measures approximately 14×14 mm and is positioned in the center of the area remaining after the bond pad has been positioned at one side of electrode 42.

Figure 11:
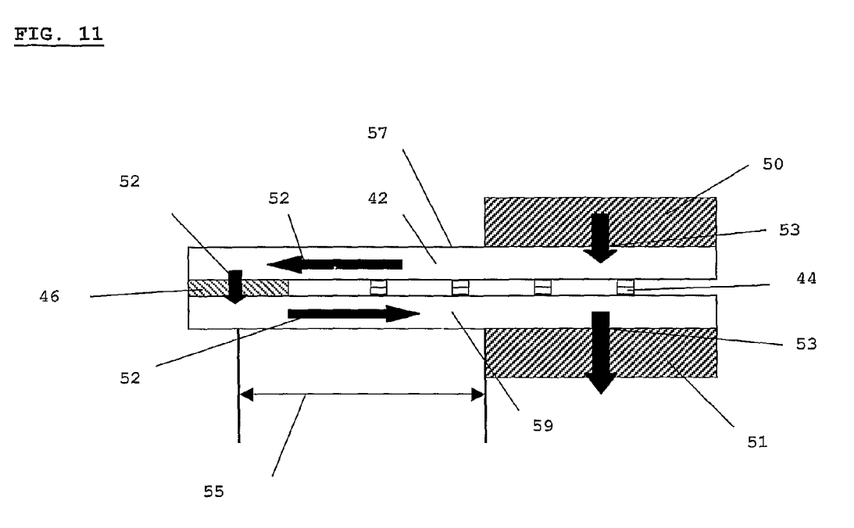
FIG. 11 shows a cross sectional view of a thermotunneling converter comprising two electrodes with spacers in between, showing the direction of heat flow through the converter.

FIG. 11 shows electrode 42 attached to a second electrode 59, of identical dimensions as electrode 42, thereby forming a thermotunneling converter 57. Area 50 on first electrode 42 represents the device to be cooled, whereas area 51 on second wafer 59 is in thermal contact with a heat sink. Arrows 53 indicate the direction in which heat flows through thermotunneling converter 57.

Because area 50 is not in close proximity to bond pad 46, there will be very little thermal leakage through bond pad 46. Arrows 52 indicate the path along which the heat will travel. Considering that the length L of the edge zone 46 is 20 mm, the active wafer is thinned down to a thickness of about 50 µm, and the distance X between bonded edge zone 46 and the active area 50 is 5 mm, as indicated by arrow 55, the thermal leakage through edge zone 46 will be about 0.3 Watt/cm². This is illustrated in Table A. It is obvious that the edge losses are further reduced when the effective area of the device is enlarged in comparison to the edge zone or the length of the thermal path is increased by methods well known in the art.

TABLE A

| Path in wafer | (L*X*d) | [20 mm * 5 mm * 50 µm] | |
|---|---|---|---|
| Therm cond. Si | 125 | W/m*K | |
| ∂T= | 50 | ° K | Total |
| $W_w$= | 0.6 | Watt | Total loss at Edge |
| $w_w$= | 0.3 | Watt/cm²$_{eff}$ | Specific loss |

$W_w$ = Heat flux through wafer to bonded area

Table B illustrates the specifications of thermotunneling converter 57, and the resulting heat flux that will be obtained.

TABLE B

| Area A of spacer dots of length | L [nm] | 350 | 1.23E−13 | m² | |
|---|---|---|---|---|---|
| Height of spacer | h [nm] | 100 | 1.00E−07 | m | |
| Distance between spacer | D [µm] | 250 | 4.00E−05 | m | $D_{max}$ = 2 × 5000 × h |
| Ratio spacer/unbounded Areas | | | 1.96E−06 | | |
| Thermal conductivity SiO | Thick films | | 1.1 | W/m/K | |
| Heat Flux through siO2 at ∂T [K] | | 50 | 5.30E+04 | W/cm | |
| Heat Flux through spacers $w_{sp}$ | | w | 0.104 | W/cm | |
| Electric Field at applied Voltage [V] | | 5 | 0.5 | MV/cm | |

It is understood that a second wafer of identical dimensions to wafer 40 is attached to wafer 40 in order to create a sheet of thermotunneling converters, which can then be cut into individual converters.

Figure 8:
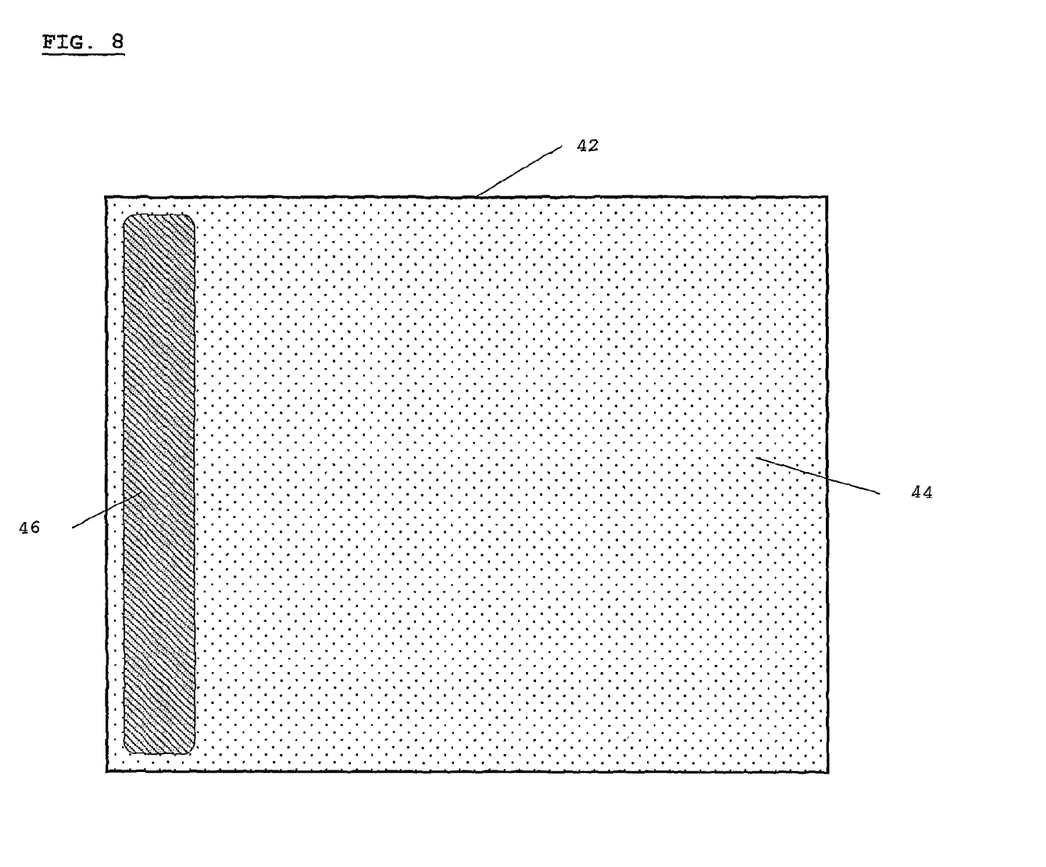
FIG. 8 shows a plan of one electrode of a thermotunneling converter comprising spacer dots and a bond pad.

FIG. 8 shows one rectangular electrode 42 of wafer 40. Rectangular electrode 42 comprises a silicon wafer covered with a layer of oxidized silicon. A bond pad 46 of 5×20 mm is positioned at one side of electrode 42 to hold the two electrodes in place. A plurality of spacer dots 44 with a width of 350 nanometers and 100 nanometers in height is arranged on rectangular electrode 42 at a distance of 250 micrometers.

As is illustrated by Table B, using the above configurations, the heat flux through the spacers $w_{ap}$ will be reduced to only 0.1 W/cm². This is a significant reduction and will allow for the converters to achieve efficient cooling.

Figure 12:
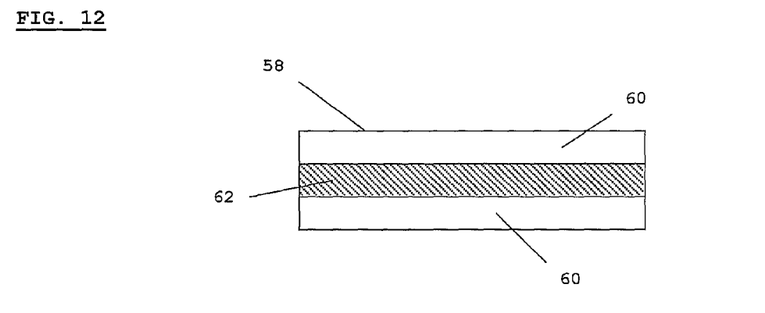

Referring now to FIG. 12, shown is a sandwich 58 comprised of two silicon wafers 60, of the same dimensions as electrodes 42 and 59, with a layer of oxidized silicon 62 positioned in between them. Oxidized silicon layer 62 has the same height of 100 nanometers as do spacer dots 44. Thus, in effect, sandwich 58 shows a device of the above method with the exclusion of the stages of forming protective dots on the oxide layer and removing the remaining oxide. Using the configurations described in Table B above, the heat flux through sandwich 58 would be 53,000 W/cm. It is thus clearly illustrated that the spacer dots provide an advantage of considerable magnitude.

There are many other possible embodiments to this invention. For example, one embodiment involves oxidizing both electrodes of a converter, creating spacers protruding from both sides. In one embodiment the spacers are formed in exactly the same place on both electrodes, so when the electrodes are bonded the spacers meet and create a gap of double the height.

In another embodiment, the spacers are formed on each electrode at double the distance needed in the above mentioned method. However, they are positioned in different places on each electrode so that when the two electrodes are bonded to form a converter, the resulting gaps between the spacers are of the size necessary for the converter to function efficiently.

Figure 13A:
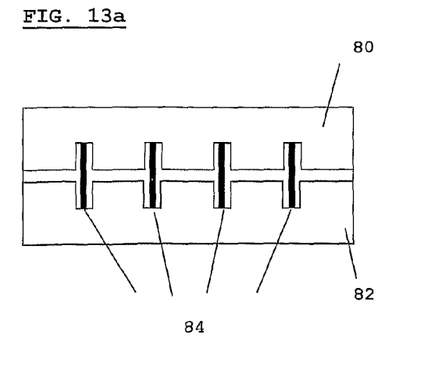
FIG. 13a shows a cross sectional views of one embodiment of the present invention: an electrode sandwich with buried spacers.

In a further embodiment, illustrated in FIGS. 13a and b, buried spacers are formed. In FIG. 13a a sandwich such as the one shown in FIG. 2 above is formed comprising two bonded silicon wafers 80 and 82 separated by an array of spacers 84. Wafers 80 and 82 are matching whereby a protrusion on wafer 80 is positioned opposite an identical indentation on wafer 82 and vice versa. However, in this embodiment, spacers 84 are formed such that they are buried in wafers 80 and 82 thereby increasing the length of the thermal pathway between the two electrodes during their operation. Buried spacers 84 may be produced using techniques known in the art and it is understood that the methods disclosed herein are by way of an example only and do not limit the present invention. Increasing the length of spacers 84 in this way, without changing the overall spacing between the diodes, increases the efficiency of the device as illustrated by the following equation for heat transfer $w_{sp}$ in the spacers:

$$W_{sp} \sim (A/l)$$

in which A is the cross sectional area and l is the length.

Figure 13B:
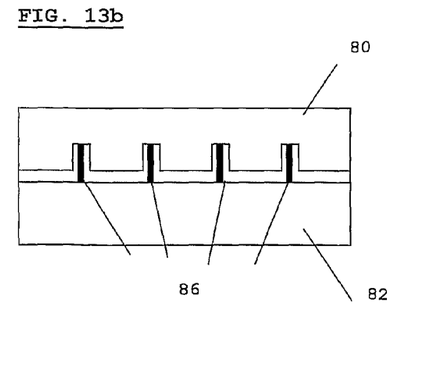
FIG. 13b shows the embodiment of FIG. 13a with buried spacers on one side only.

In FIG. 13b spacers 88 are buried on one side only.

In another embodiment, a multitude of Cool Chips is formed from two wafers that are prepared according to this invention. The composite wafer is then diced and the individual Cool Chip dies are then bonded to individual integrated circuit dies.

In another embodiment, a Cool Chip die is mounted onto a conventional heatsink which is then mounted onto a conventional integrated circuit chip package, providing cooling below ambient temperature to the integrated circuit.

In other embodiments, alternative methods are used to create a layer on an electrode surface.

While the present invention has been described with respect to a limited number of embodiments, those skilled in the art will appreciate numerous modifications and variations therefrom. It is intended that the appended claims cover all such modifications and variations as fall within the true spirit and scope of this present invention.

INDUSTRIAL APPLICABILITY

The present invention provides thermionic/thermotunneling devices for thermoelectric conversion in which the gap between electrodes is created and maintain without the use of active elements, and in which problems of thermal conduction between its layers are reduced or eliminated. The devices are able to operate over long periods of time at high temperatures.

The invention claimed is:

1. A thermoelectric converter comprising:
   a) a first wafer carrying a first array comprising a plurality of electrodes, said first array disposed horizontally;
   b) a second wafer carrying a second array comprising a plurality of electrodes having surfaces substantially facing said electrodes of said first array;
   c) a respective spacer or plurality of spacers disposed between said arrays to allow gaps of 10-15 nanometers between said electrodes, wherein the surface area of the spacer or plurality of spacers in direct contact with said surfaces is less than the surface area of said surfaces, and wherein said spacers comprise oxidized silicon.

2. The converter of claim 1, wherein one or more of said electrodes comprises a silicon substrate.

3. The converter of claim 2 wherein said silicon substrate includes a coating formed of a hard protective material.

4. The converter of claim 3 wherein said coating of said hard protective material comprises a material that reduces the diffusivity of metals into silicon.

5. The converter of claim 3 wherein said coating of said hard protective material comprises CVD diamond, $Al_2O_3$, $Si_3N_4$, or a metal.

6. The converter of claim 1, wherein one or more of said electrodes includes a substrate comprising a material with a high melting temperature, thereby preventing said material from reacting with, diffusing into or flowing into adjacent regions.

7. The converter of claim 6, wherein said substrate comprises a refractory material.

8. The converter of claim 7 wherein said refractory material comprises a ceramic.

9. The converter of claim 6, wherein said substrate includes a coating formed from a thin film comprising an amorphous or poly-crystalline silicon.

10. The converter of claim 1, wherein a surface of one or more of said plurality of electrodes has a periodically repeating structure which creates de Broglie wave interference.

11. The converter of claim 10 wherein said periodically repeating structure comprises one or more indents of a depth less than approximately 50 nm and a width less than approximately 1 μm, whereby deBroglie interference is created and work function of said plurality of electrodes is reduced.

12. The converter of claim 1, wherein said spacers further comprise a protective layer.

13. The converter of claim 1, wherein said first array comprises a hot side and said second array comprises a cold side.

14. The converter of claim 1, wherein said first array comprises a cold side and said second array comprises a hot side.

15. The converter of claim 1, wherein said first wafer carrying said first array of said plurality of electrodes comprises a silicon substrate with a thin surface film of oxidized silicon, and wherein said electrodes include exposed areas of silicon where said oxidized silicon has been removed and areas where said oxidized silicon has not been removed comprising said spacers.

16. The converter of claim 15, wherein said spacers include a protective layer on said oxidized silicon.

17. The converter of claim 15, wherein said exposed areas of said electrodes have a surface layer comprising a material structured to have a work function of 1 eV or less.

18. The converter of claim 1, wherein said electrodes are rectangular and said spacers comprise a plurality of dots arranged on said rectangular electrodes.

19. A method for building a thermoelectric converter comprising the steps of:

a) providing a first wafer carrying a first array comprising a plurality of electrodes and disposing said first array horizontally;
b) providing a second wafer carrying a second array comprising a plurality of electrodes having surfaces substantially facing said electrodes of said first array;
c) forming a respective spacer or plurality of spacers disposed between said first and second arrays to create gaps of 10-15 nanometers between said electrodes by oxidizing said electrodes, protecting selected areas of said oxidized electrodes, and removing areas of said oxidized electrodes which have not been protected, whereby said protected areas remain as protrusions comprising said spacers, wherein the selected protected areas represent a minority of said oxidized electrodes and the surface area of the spacer or plurality of spacers in direct contact with said electrode surfaces is less than the surface area of said electrode surfaces; and
d) connecting said electrodes of said first array to a said electrodes of said second array, whereby said electrodes are positioned substantially facing each other, with a gap of 10-15 nanometers between them maintained by said protrusions.

20. The method of claim 19 wherein said step of protecting selected areas of said oxidized surface comprises forming dots by means of photolithographic processes.

21. The method of claim 19 wherein said step of removing unprotected areas of said oxidized surface comprises etching.

22. The method of claim 19 additionally comprising the step of: introducing a layer of a material having a work function of 1 eV or less onto a surface of said first electrode array.

23. The method of claim 19 wherein said step of connecting said first electrode array to said second electrode array is performed in a vacuum chamber.

24. The method of claim 19 wherein said step of connecting said first electrode array to said second electrode array is performed in a chamber filled with a controlled gas atmosphere which reacts with the electrode material and forms a vacuum between the electrodes.

25. The method of claim 19, further comprising bonding a wafer with said spacers to a completely processed sheet of silicon carrying a multitude of integrated circuits by:
   a) thinning said sheet of integrated circuits to a thickness of 50-200 μm by grinding or etching the sheet from its back side,
   b) polishing the back side of said sheet of integrated circuits to obtain a surface roughness of 1-20 Å to obtain conditions for direct bonding,
   c) optionally adding a surface film or structure to lower the work function of the integrated circuit wafer back side,
   d) bonding said sheet of integrated circuits to a second wafer containing spacers at temperatures not higher than the maximum temperature the integrated circuit wafer can withstand, and
   e) dicing the composite wafer to form individual integrated circuits with integrated active cooling.

26. The method of claim 25 wherein said wafer comprises a silicon wafer bonded to a wafer with an array of electrodes that has said spacers comprising of:
   a) bonding said wafers to form a composite wafer, and
   b) dicing said composite wafer to obtain individual diodes.

27. The method of claim 26 wherein said individual diodes are mounted to a conventional heat sink to which standard, packaged integrated circuits are mounted.

28. The method of claim 26 wherein said individual diodes are mounted on an enclosure wherein said enclosure is suitable for power generation.

29. The method of claim 25, wherein the back side of said sheet of integrated circuits is polished to obtain a surface roughness of less than 5 Å.

30. The method of claim 19, wherein said first or said second array comprises silicon and a hard protective material is coated on said silicon.

31. The method of claim 30, wherein said hard protective material is physically or chemically introduced to said silicon to coat said silicon.

32. The method of claim 19, wherein said first or second array further comprises a substrate, wherein said substrate is coated with a thin film coating of amorphous or poly-crystalline silicon and said thin film is smoothened by chemical-mechanical polishing or etching techniques.

33. The method of claim 19, wherein said spacers are formed in the same place on each of said electrodes, wherein when said first array of electrodes and said second array of electrodes are connected, said spacers on both arrays meet and create said gaps between said electrodes with a distance equal to twice the height of each said spacer.

* * * * *